United States Patent
Pengelly

(10) Patent No.: US 7,936,212 B2
(45) Date of Patent: May 3, 2011

(54) PROGRESSIVE POWER GENERATING AMPLIFIERS

(75) Inventor: Raymond Sydney Pengelly, Durham, NC (US)

(73) Assignee: Cree, Inc., Durham, NC (US)

( * ) Notice: Subject to any disclaimer, the term of this patent is extended or adjusted under 35 U.S.C. 154(b) by 16 days.

(21) Appl. No.: 12/118,202

(22) Filed: May 9, 2008

(65) Prior Publication Data

US 2009/0278599 A1    Nov. 12, 2009

(51) Int. Cl.
*H03F 3/68*    (2006.01)
(52) U.S. Cl. .................................. 330/124 R; 330/295
(58) Field of Classification Search .............. 330/124 R, 330/295, 286, 84
See application file for complete search history.

(56) References Cited

U.S. PATENT DOCUMENTS

| | | | |
|---|---|---|---|
| 4,305,043 | A | 12/1981 | Ho et al. |
| 6,316,793 | B1 | 11/2001 | Sheppard et al. |
| 6,515,541 | B2 | 2/2003 | Cheng et al. |
| 6,548,333 | B2 | 4/2003 | Smith |
| 6,737,922 | B2 | 5/2004 | Pengelly et al. |
| 6,791,417 | B2 | 9/2004 | Pengelly et al. |
| 6,849,882 | B2 | 2/2005 | Charvarkar et al. |
| 6,922,102 | B2 | 7/2005 | Myer et al. |
| 6,982,204 | B2 | 1/2006 | Saxler et al. |
| 7,064,606 | B2 * | 6/2006 | Louis ...................... 330/124 R |
| 7,248,108 | B2 | 7/2007 | Fratti |
| 7,342,444 | B2 * | 3/2008 | Kim et al. ................. 330/124 R |
| 7,382,194 | B2 * | 6/2008 | Apel ............................. 330/295 |

FOREIGN PATENT DOCUMENTS

| | | |
|---|---|---|
| JP | 2006157900 (A) | 6/2006 |
| JP | 2006191581 (A) | 7/2006 |
| JP | 200652579 | 11/2006 |
| JP | 2007535828 (T) | 12/2007 |
| WO | WO 02/101918 A1 | 12/2002 |
| WO | WO 2004/088837 | 10/2004 |
| WO | WO 2004/100215 A2 | 11/2004 |

OTHER PUBLICATIONS

Cripps, S.C., Contribution WSG6, "Efficiency Enhancement Techniques for High Power PA's," 2007 IEEE Radio Frequency Integrated Circuits (RFIC) Symposium, Hawaii Convention Center, Jun. 3-5, 2007.
Doherty, W.H., "A New High Efficiency Power Amplifier for Modulated Waves," *Proceedings of the Institute of Radio Engineers*, Sep. 1936, pp. 1163-1182, vol. 24, No. 9.
EP Search Report for Application No. 09156926.9-2215, Mailed Aug. 27, 2009.

* cited by examiner

*Primary Examiner* — Hieu P Nguyen
(74) *Attorney, Agent, or Firm* — Myers Bigel Sibley & Sajovec

(57) ABSTRACT

A power amplifier circuit includes an unequal power splitter that splits an input signal using an unequal power split and provides a first power level signal and a second power level signal. A first amplifier path includes a first transistor amplifier that amplifies the first power level signal, and a second amplifier path includes a second transistor amplifier that amplifies the second power level signal. The second transistor amplifier is configured to turn on at a different power level of the input signal than the first transistor amplifier. An unequal combiner combines the amplified first power level signal and the amplified second power level signal.

16 Claims, 7 Drawing Sheets

PROGRESSIVE POWER GENERATING AMPLIFIERS

BACKGROUND

This invention relates generally to electronic circuits, and more particularly, to RF power amplifier circuits.

Power amplifiers, such as power amplifiers used in base stations of cellular communication systems, often operate at output power levels much lower than peak power. Unfortunately, the back-off power level reduces the efficiency of the power amplifier in the transmitter. In a conventional amplifier there is a direct relationship between efficiency and the input drive level. Therefore, high efficiency (DC to RF conversion efficiency) is often not obtained until the RF input power level becomes sufficiently high to drive the amplifier into compression or saturation. In multi-carrier communication systems, it is desirable for an amplifier to remain as linear as possible, this region of high efficiency cannot be used.

A power amplifier circuit design which provides improved efficiency in back-off power levels is the Doherty amplifier circuit, which combines power from a main or carrier amplifier and from an auxiliary or peak amplifier. See, W. H. Doherty, "A New High-Efficiency Power Amplifier for Modulated Waves," Proc. IRE Vol. 24, No. 9, pp. 1163-1182, 1936. A conventional Doherty circuit 20 illustrated in FIG. 1A. As shown therein, an input signal applied to an input terminal 21 is split by a splitter 22. A main or carrier amplifier 23 and peak amplifier 26, which receive the input signal from the splitter 22, are designed to deliver maximum power with optimum efficiency to a load R. The carrier amplifier 23 receives the input signal directly from the splitter 22, while the peak amplifier 26 receives the input signal through a quarter wave (90°) transformer 25. The output of the carrier amplifier 23 passes through another quarter wave (90°) transformer 24, and is combined with the output of the peak amplifier 26 at a combining node 27. Accordingly, the outputs of the carrier amplifier 23 and the peak amplifier 26 are not isolated from one another. Thus, when the peak amplifier 26 turns on, the apparent load presented to the carrier amplifier 23 changes.

The carrier amplifier 23 is biased as a normal Class B amplifier, while the peak amplifier 26 is designed to only amplify signals which exceed some minimum threshold. For an LDMOS power transistor, this can be accomplished by DC biasing the transistor below its pinch-off voltage, for operation similar to Class C. The outputs of the two amplifiers are connected by a quarter-wave transmission line 24 of characteristic impedance R, and a load of one-half of the optimum load R is attached to the output of the peak amplifier 26. The RF input power is divided equally with a quarter-wave delay 25 at the input to the peak amplifier 26, thus assuring that the output power of the two amplifiers at the load R/2 28 will be in phase.

The Doherty amplifier circuit achieves high efficiency prior to compression by operating the Class B carrier amplifier 23 into an apparent load impedance two times larger than its optimum load. (Before the peak amplifier 26 becomes active, the apparent load impedance presented to the carrier amplifier 23 is 2R due to the presence of quarter wave transformer 24.) Thus, the carrier amplifier 23 compresses and reaches peak efficiency at half of its maximum power. The second or peak amplifier becomes active only during the peaks of the input signal. When the peak amplifier is active, the load impedance apparent at the output of the carrier amplifier 23 is reduced. Maximum efficiency is again achieved when the peak amplifier 26 outputs its full power. Thus, the carrier amplifier 23 is kept on the verge of saturation for a 6 dB range of output power and near-peak efficiency can be maintained.

When the input RF power into the Doherty amplifier circuit is not sufficient to turn on the peak amplifier 26, all of the output power is supplied by the carrier amplifier 23. When the peak amplifier 26 is off, its output impedance is very high and the output power of the carrier amplifier 23 is entirely delivered to the load R/2. As discussed above, the load actually presented to the carrier amplifier across the quarter-wave transformer 24 is 2R. The device current is therefore one-half of what is delivered at maximum power while the voltage is saturated. This results in the device delivering half its maximum output power. Since both the RF and DC components of the current are half their peak values, the efficiency will be at its maximum with half of the maximum output power of the carrier amplifier being supplied to the load with maximum linear efficiency.

When sufficient input RF power is provided to allow the peak amplifier 26 to become saturated, the two parallel amplifiers are evenly delivering maximum output power to the load R/2. The load apparent to each amplifier is then the optimum load R, and the load at both ends of the quarter-wave transformer 24 will remain at R. The peak amplifier 26 is designed to begin operation when the carrier amplifier 23 just begins to saturate. Maximum linear efficiency is obtained at this point. As the input RF drive is further increased, the peak amplifier begins to turn on and deliver output power to the load. The additional current supplied by the peak amplifier 26 has the effect of increasing the load impedance at the output of the quarter-wave transformer 24. The effective change at the carrier amplifier end of the transformer 24 will be a reduction in the apparent load impedance and enabling the carrier amplifier 23 to deliver more power while its voltage remains saturated. The efficiency between the limits will fall off only slightly from the maximum since the duty factor of the peak amplifier is relatively low.

Some efforts have been made to extend the range over which the output power and near-peak efficiency of a Doherty amplifier can be maintained. For example, U.S. Pat. No. 6,791,417, entitled "N-Way RF Power Amplifier Circuit With Increased Back-Off Capability And Power Added Efficiency Using Selected Phase Lengths And Output Impedances," discloses a Doherty amplifier with multiple peak amplifiers. A four-way Doherty amplifier circuit 30 is illustrated in FIG. 1B. As shown therein, a carrier amplifier 33 and the three peak amplifiers 36A-C are provided, with the peak amplifiers 36A-C connected through 90° transformers 35A-C to an output load 38. A single 90° transformer 34 connects a four-way splitter 32 to the carrier amplifier 34. By setting the DC bias on each of the peak amplifiers 36A-C to appropriate values, the added peak amplifiers allow the Doherty action to be extended. The outputs of carrier amplifier 33 and peak amplifiers 36A-C are combined at combining node 37. For each peak amplifier that is added above the first, there will be a corresponding increase of 6 dB in the power range over which the peak efficiency will be maintained. Some limitation in efficiency will result due to the finite loss in the N-way splitter. The four-way amplifier extends the range of efficient power to a theoretical value of 18 dB. The four-way configuration can provide an overall power increase of 3 dBm compared to a two-way Doherty amplifier circuit. Thus, a 120 watt peak amplifier can be provided by a four-way Doherty arrangement with each path (a carrier and three peak amplifiers) utilizing 30 watt transistors.

An N-way Doherty amplifier with unequal input power division is disclosed in U.S. Pat. No. 6,737,922 entitled "N-Way RF Power Amplifier Circuit With Increased Back-Off Capability And Power Added Efficiency Using Unequal Input Power Division." A three-way Doherty amplifier circuit 40 with unequal input power division is illustrated in FIG. 1C. In the circuit 40, input power is split and applied unequally to a carrier amplifier 43 and one or more peak amplifiers 46A, 46B to realize increased power added efficiency (PAE) and linearity.

In particular, an input signal applied at an input port 41 is split by a first splitter 42A. A signal level of −4.8 dB is applied to the carrier amplifier 43, while a signal level of −1.8 dB is further split by a second splitter 42B, which splits the −1.8 dB input signal equally and applies the split signal to the peak amplifiers 46A through quarter wave transformers 45A, 45B. The outputs of the carrier and peak amplifiers are combined at a combining node 47, which is coupled to a load 48.

In a conventional Doherty power amplifier circuit, equal signal levels are delivered to the carrier and peak amplifiers. Since the peak amplifier bias point is purposely set to be close to threshold it can be advantageous to drive the peak amplifier (s) with a higher signal level compared with the carrier amplifier. Such an unequal power split can allow the peak amplifiers 46A, 46B to be "pumped" by the RF signal more efficiently than in an equal split version, thus compensating for the transconductance characteristics of the transistor close to threshold.

One potential drawback to Doherty amplifiers arises from the use of circuit components, such as the quarter wave transformers attached to each transistor and the direct combining node at which the transistor outputs are combined. These circuit components can restrict the bandwidth of the amplifier, which can impair the efficiency and/or gain flatness of the amplifier over a range of operating frequencies.

SUMMARY

A power amplifier circuit according to some embodiments includes an input node configured to receive an input signal and an unequal power splitter coupled to the input node and configured to split the input signal using an unequal power split and to provide a first power level signal to a first output node and a second power level signal to a second output node. The second power level signal has a different power level than the first power level signal. The circuit further includes a first amplifier path coupled to the first output node of the unequal power splitter and including a first transistor amplifier configured to receive and amplify the first power level signal, and a second amplifier path coupled to the second output node of the unequal power splitter and including a second transistor amplifier configured to receive and amplify the second power level signal. The second transistor amplifier is configured to turn on at a different power level of the input signal than the first transistor amplifier. The circuit further includes an unequal combiner configured to receive and combine the amplified first power level signal from the first amplifier path and the amplified second power level signal from the second amplifier path.

The first transistor amplifier may be biased for operation in Class A/B, and the second transistor amplifier may be biased for operation in Class C.

The unequal power splitter may be configured to split the input signal at a power dividing ratio, and the unequal power combiner may be configured to combine the amplified first power level signal and the amplified second power level signal at a same ratio as the power dividing ratio.

The unequal power splitter may be configured to split the input signal into a −A dB signal at the first output node and a −B dB signal at the second output node, and the unequal power combiner may be configured to combine the amplified first power level signal at a level of −A dB and the amplified second power level signal at a level of −B dB, where A is not equal to B. In some embodiments, A equals −1 and B equals −6.9.

The power amplifier circuit may further include an input capacitor coupled between the input node and the unequal power splitter. The power amplifier circuit may further include a transformer coupled to an output of the unequal combiner.

The first transistor amplifier may have a first gate width and the second transistor amplifier may have a second gate width larger than the first gate width.

The power amplifier circuit may further include a first transmission line between the first transistor amplifier and the unequal combiner and a second transmission line between the second transistor amplifier and the unequal combiner. The first transmission line may have a phase length that is different from a phase length of the second transmission line.

The unequal splitter may include an in phase splitter and the unequal combiner may include an in phase combiner.

The unequal power splitter may be further configured to provide a third power level signal to a third output node. The third power level signal may have a different power level than the first power level signal. The power amplifier may further include a third amplifier path coupled to the third output node of the unequal power splitter and including a third transistor amplifier configured to receive and amplify the third power level signal. The third transistor amplifier may be configured to turn on at a different power level than the first or second transistor amplifiers, and the unequal combiner may be further configured to receive and combine the amplified third power level signal from the third amplifier path with the amplified first and second power level signals from the first and second amplifier paths.

The unequal power splitter may be configured to split the input signal at a power dividing ratio, and the unequal power combiner is configured to combine the amplified first power level signal and the amplified second power level signal at a same ratio as the power dividing ratio.

The unequal power splitter may be configured to split the input signal into a −A dB signal at the first output node, a −B dB signal at the second output node and a −C dB signal at the third output node, and the unequal combiner may be configured to combine the amplified first power level signal at a level of −A dB, the amplified second power level signal at a level of −B dB, and the amplified third power level signal at a level of −C dB, A is not equal to B and A is not equal to C. In some embodiments, A equals −1.5 and B equals −8.4 and C equals −8.4.

The first transistor amplifier may be biased for operation in Class A/B, the second transistor amplifier may be biased for operation in Class B or Class C, and the third transistor amplifier may be biased for operation in Class C.

The first transistor amplifier may have a first gate width, the second transistor amplifier may have a second gate width that is larger than the first gate width, and the third transistor amplifier may have a third gate width that is larger than the first gate width.

The power amplifier circuit may further include a first transmission line between the first transistor amplifier and the unequal combiner, a second transmission line between the second transistor amplifier and the unequal combiner, and a third transmission line between the third transistor amplifier and the unequal combiner. The first transmission line may have a phase length that is different from a phase length of the second transmission line or the third transmission line.

A power amplifier circuit according to further embodiments includes a first transistor amplifier configured to receive and amplify an input signal, a second transistor amplifier configured to receive and amplify a scaled version of the input signal, the second transistor amplifier is biased in a different class of operation from the first transistor amplifier, and an unequal combiner configured to receive and combine the amplified first power level signal output by the first transistor amplifier and the amplified second power level signal output by the second transistor amplifier at a power combining ratio that is not equal to 1.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION

Figure 1A:
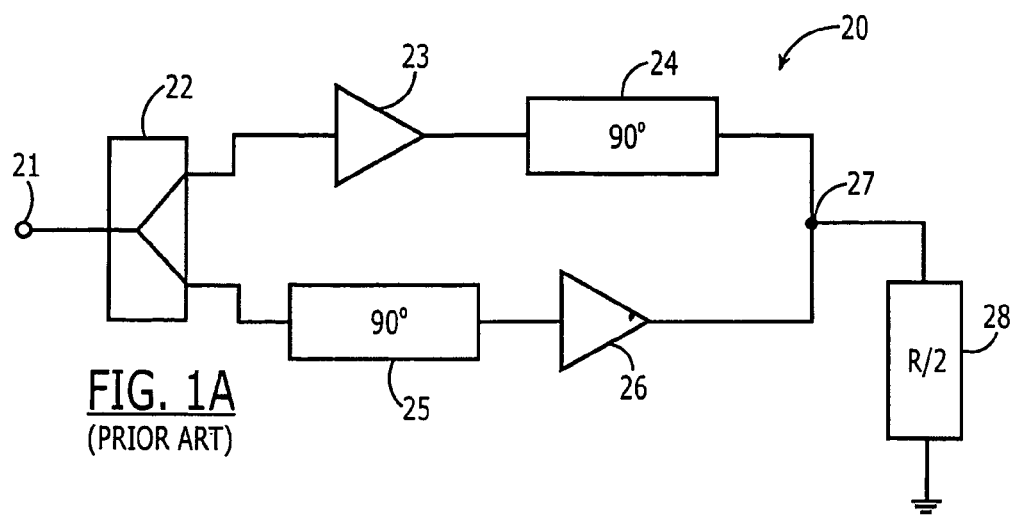
FIGS. 1A-1C illustrate various configurations of Doherty amplifiers.
Figure 1B:
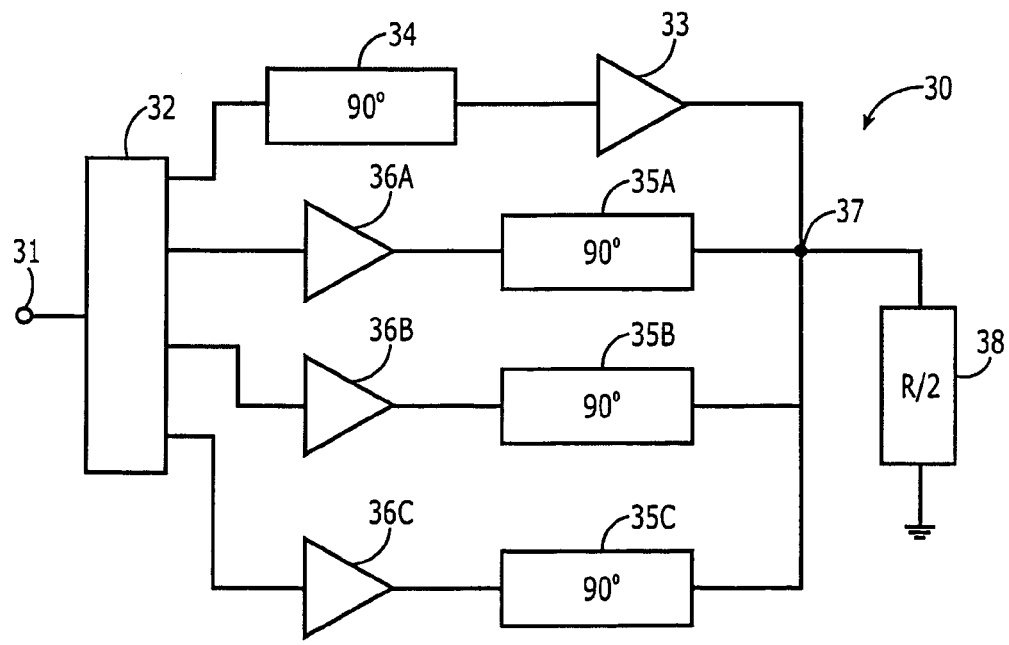
Figure 1C:
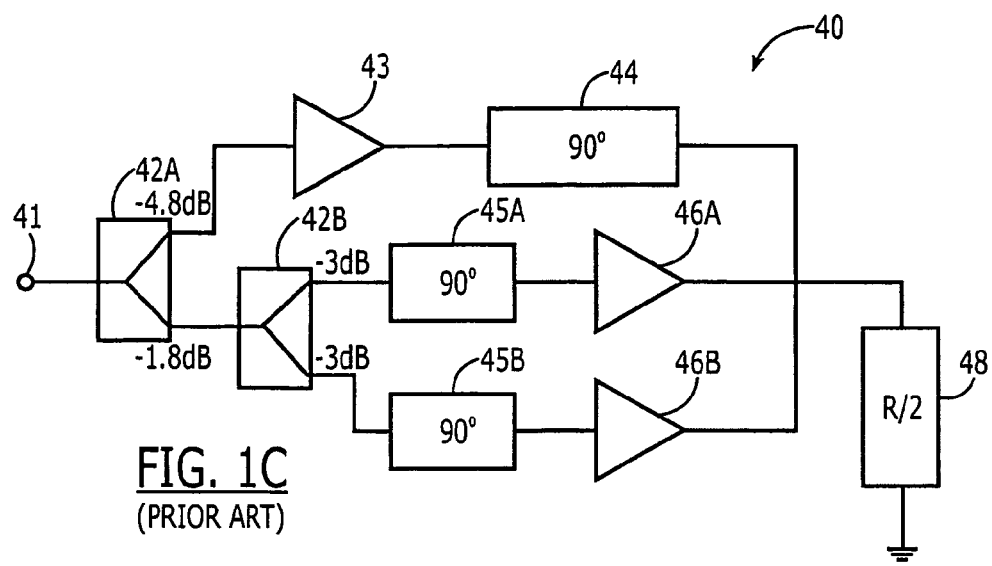

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Some embodiments of the invention provide power amplifier circuits that can have increased efficiency under backed off (linear) conditions that are typically used in a variety of communication applications. A circuit according to some embodiments includes parallel amplifier pads in which the transistors and each path are biased and matched differently. Input power is divided unequally between the parallel amplifiers and, because the transistors are biased differently in each path, the point at which each amplifier contributes power is different. Such an amplifier circuit is referred to herein as a progressive power generating amplifier (PPGA).

The power contributed by individual paths are combined with an unequal power combiner. The unequal power combiner may mirror the power splitter on the input side of the amplifier. Because the amplifiers in each amplifier path turn on a different input power levels (due to their differing bias and the different power split) efficiency of the amplifier circuit at output power levels less than the compression point can be significantly enhanced compared to a conventional "single ended" amplifier.

A circuit according to some embodiments can be distinguished from a Doherty amplifier arrangement, as there may be no direct combining node at the outputs of each transistor path. That is, the output combiner provided according to some embodiments provides isolation between the different amplifier chains. Thus when one of the parallel amplifiers terms on, it does not change the impedance presented to any other amplifier in a circuit.

Figure 2:
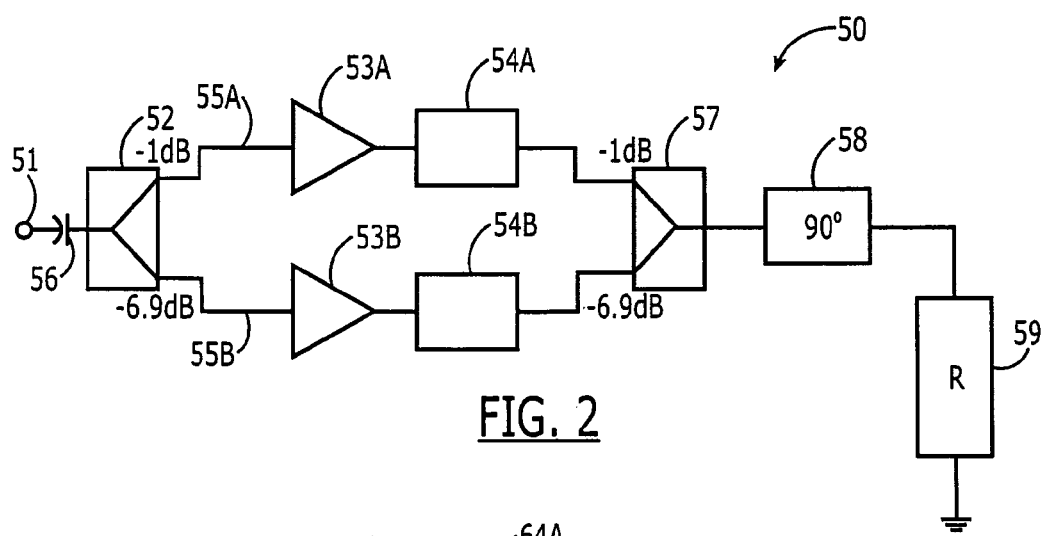
FIG. 2 is a schematic circuit diagram of a two-way progressive power generating amplifier circuit according to some embodiments.

A two-way progressive power generating amplifier (PPGA) circuit 50 according to some embodiments is illustrated in FIG. 2. As shown therein, the PPGA 50 includes an input node 51 that is coupled to an unequal power splitter 52. In general, an unequal power splitter splits an input signal into two or more output signals having unequal power levels. In the embodiment illustrated in FIG. 2, the unequal power splitter 52 splits the input power and applies −1 dB to a first amplifier path 55A and −6.9 dB to a second amplifier path 55B.

The first amplifier path 55A includes a first transistor amplifier 53A, and the second amplifier path 55B includes a second transistor amplifier 53B. The first and second transistor amplifiers 53A, 53B are connected to an unequal combiner 57 through respective 50-Ohm transmission lines 54A, 54B. In general, an unequal combiner combines two or more input signals of unequal power into a single output signal. For example, for a −1 dB/−6 dB unequal combiner, if power levels of 1.26 watts and 4 watts were input to the relevant ports then the full power of 5.26 watts would be outputted. The phase of the transmission lines 54A, 54B can be selected to improve the gain flatness and efficiency of the circuit. In particular, providing a phase difference between the transmission lines 54A, and 54B can improve the gain flatness and efficiency of the circuit, because the path 55B presents a different impedance to the unequal combiner 57 when the transistor amplifier 53B starts to turn on. The phase difference between transmission lines 54A, 54B helps to match the impedance of the two paths 55A, 55B as seen by the unequal combiner 57.

In some embodiments, the transmission line 54A can have an electrical length of 0°, while the transmission line 54B can have an electrical length of 15°. In further embodiments, the transmission line 54A can have a non-zero electrical length, such as 15°, while the transmission line 54B can have an electrical length in some embodiments that maintains a desired phase difference of between the transmission lines 54A, 54B. For example, the transmission line 54A can have an electrical length of 15°, while the transmission line 54B can have an electrical length of 30°.

The unequal combiner 57 can "mirror" the unequal splitter 52. That is, the unequal combiner can receive −1 dB from the first amplifier path 55A and −6.9 dB from the second amplifier path 55B. An unequal combiner can combine a −1 dB signal and a −6.9 dB signal and output a 0 dB (i.e. full power) combined signal with little or no loss. It will be appreciated, however, that the unequal combiner 57 can combine signals from the amplifier paths 55A, 55B using different ratios than the unequal splitter 52 in some embodiments.

The first transistor amplifier 53A may be biased for operation in Class A/B, and may be configured to turn on at low input power levels. The second transistor amplifier 53B may be biased for operation in Class C, and may be configured to turn on at higher input power levels of the input signal applied to the input node 51 than the first transistor amplifier 53A. Some digital modulation schemes, such as WiMax, require linear operation at relatively high peak-to-average power ratios. The first transistor amplifier 53A is biased to amplify a lower power input signal with high linearity and efficiency, while the second transistor amplifier 53B is biased to amplify a higher power input signal with high linearity and efficiency.

The first and second transistor amplifiers 53A, 53B may include RF power transistors, such as GaN-based high electron mobility transistors (HEMTs). Suitable structures for GaN-based HEMTs that may be used in embodiments of the present invention are described, for example, in commonly assigned U.S. Pat. No. 6,316,793 and U.S. Publication No. 2002/0066908A1 filed Jul. 12, 2001 and published Jun. 6, 2002, for "Aluminum Gallium Nitride/Gallium Nitride High Electron Mobility Transistors Having A Gate Contact On A Gallium Nitride Based Cap Segment And Methods Of Fabricating Same," U.S. Publication No. 2002/0167023 filed May 11, 2001 and published Nov. 14, 2002 for "Group Iii Nitride Based High Electron Mobility Transistor (HEMT) With Barrier/Spacer Layer," United States Publication No. 2002/0167023A1 to Smorchkova et al., published Nov. 14, 2002, entitled "Group-Iii Nitride Based High Electron Mobility Transistor (HEMT) With Barrier/Spacer Layer" and United States Publication No. 2004/0061129 filed Jul. 11, 2003 and published Apr. 1, 2004 for "Nitride-Based Transistors And Methods Of Fabrication Thereof Using Non-Etched Contact Recesses," the disclosures of which are hereby incorporated herein by reference in their entirety. Other types of transistors, such as silicon LDMOS, silicon carbide MESFET, GaAs HEMT and/or SiGe HBTs can be used.

In some embodiments, The first and second transistor amplifiers 53A, 53B may be equally sized (i.e. may have the same gate width, etc.). However, in some embodiments, the transistors can have different gate widths, which can provide enhanced backup efficiency and/or amplifier gain. For example, the first transistor amplifier 53A can have a shorter gate width compared to the second transistor amplifier 53B. Thus, the second transistor amplifier, which is biased to turn on at higher power levels, can be capable of generating higher output power under higher input power conditions while retaining a high degree of linearity.

The combined signal is applied to a load 59 having impedance R through a 900 impedance matching transformer 58. It will be appreciated that the term "transformer" is used herein in a general sense to include any reactive components that can change the phase of an input signal, and can include, for example, a transmission line.

Some improvements to the gain and input/output return losses of the PPGA circuit 50 can be realized by optimizing the transformer 68 on the output of the circuit. In some embodiments, a series capacitor 56 is provided at the input of the circuit 50, which can help to limit reflections back through the unequal power splitter 52 to the input port 51. That is, an in-phase power splitter, such as the unequal power splitter 52, may have little isolation between the input and output ports. As the second transistor 53B starts to turn on, the impedance presented at the outputs of the power splitter 52 can change. Providing the series capacitor 56 at the input can help to increase the average input impedance of the circuit and thereby improve the input reflection coefficient of the circuit.

Figure 3:
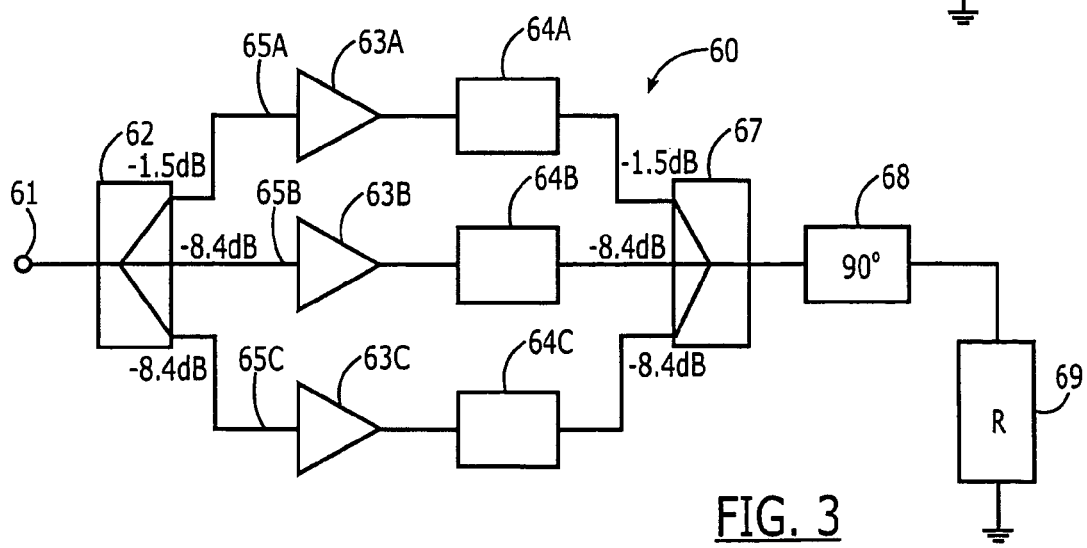
FIG. 3 is a schematic circuit diagram of a three-way progressive power generating amplifier circuit according to some embodiments.

A three-way progressive power generating amplifier (PPGA) circuit 60 according to some embodiments is illustrated in FIG. 3. A three-way PPGA may exhibit improved efficiency at higher backup power conditions compared to a two-way PPGA circuit. As shown in FIG. 3, the three-way PPGA 60 includes an input node 61 that is coupled to an unequal power splitter 62. In the embodiment illustrated in FIG. 3, the unequal power splitter 62 splits the input power and applies −1.5 dB to a first amplifier path 65A, −8.4 dB to a second amplifier path 65B, and −8.4 dB to a third amplifier path 65C.

The first amplifier path 65A includes a first transistor amplifier 63A, the second amplifier path 65B includes a second transistor amplifier 63B, and the third amplifier path 65C includes a third transistor amplifier 63C. The first, second and third transistor amplifiers 63B, 63C are connected to an unequal combiner 67 through respective 50-Ohm transmission lines 64A, 64B, and 64C. The transmission lines 64A, 64B, and 64C can have an electrical length that is selected to provide a matched output impedance as seen by the combiner 67.

The unequal combiner 67 can "mirror" the unequal splitter 62. That is, the unequal combiner can receive −1.8 dB from the first amplifier path 65A and −8.4 dB from each of the second and third amplifier paths 65B, 65C. An unequal combiner can combine a −1.8 dB signal and two −8.4 dB signals and output a 0 dB (i.e. full power) combined signal with little or no loss. However, the unequal combiner 67 can combine signals from the amplifier paths 65A, 65B using different ratios than the unequal splitter 62 in some embodiments.

The first transistor amplifier 63A may be biased for operation in Class A/B, and may be configured to turn on at low input power levels. The second and third transistor amplifiers 63B, 63C may be biased for operation in Class C, and may be configured to turn on at higher input power levels. In some embodiments, all of the bias points for the transistor amplifiers 63A-C can be different. For example, the first transistor amplifier 63A may be biased for operation in Class A/B, the second transistor amplifier 63B may be biased for operation in Class B, and the third transistor amplifier 63C may be biased for operation in Class C, so that all three amplifiers turn on sequentially as the input power is increased.

The combined signal is applied to a load 69 having impedance R through a 90° impedance matching transformer 68.

Accordingly, a circuit according to some embodiments may include an unequal in phase power divider, such as an unequal Wilkinson divider, at the input to the transistor paths as well as a similar in phase unequal power combiner at the output. There may be no direct connections between the transistors. The transistors in the amplifier paths are biased differently and have different input RF power levels, thus turning on the transistors a progressively different power levels. Full output power is achieved, as with an equivalently sized single ended our amplifier, when all paths are fully powered up. An amplifier circuit according to some embodiments may have a bandwidth that is controlled by the transistor matching networks, and not by any additional components. Thus, an amplifier circuit according to some embodiments may have a flatter gain characteristic as a function of frequency, as well as improved efficiency enhancement bandwidth.

In addition, since an amplifier circuit according to some embodiments can employ an unequal in phase splitter, coupler or quad power combiner, the output return loss of the circuit may be higher and more constant with drive level compared to a Doherty circuit, in which the output return loss is directly related to our drive level coupled through the Doherty combining node.

Two embodiments of PPGA circuits using GaN HEMT transistors have been simulated. The first simulated circuit is a two-way PPGA circuit including −1 dB and −6.9 dB splitter/combiners as illustrated in FIG. 2. The second circuit is a three-way PPGA circuit including −1.5 dB, −8.4 dB and −8.4 dB splitter/combiners as illustrated in FIG. 3.

Figure 4A:
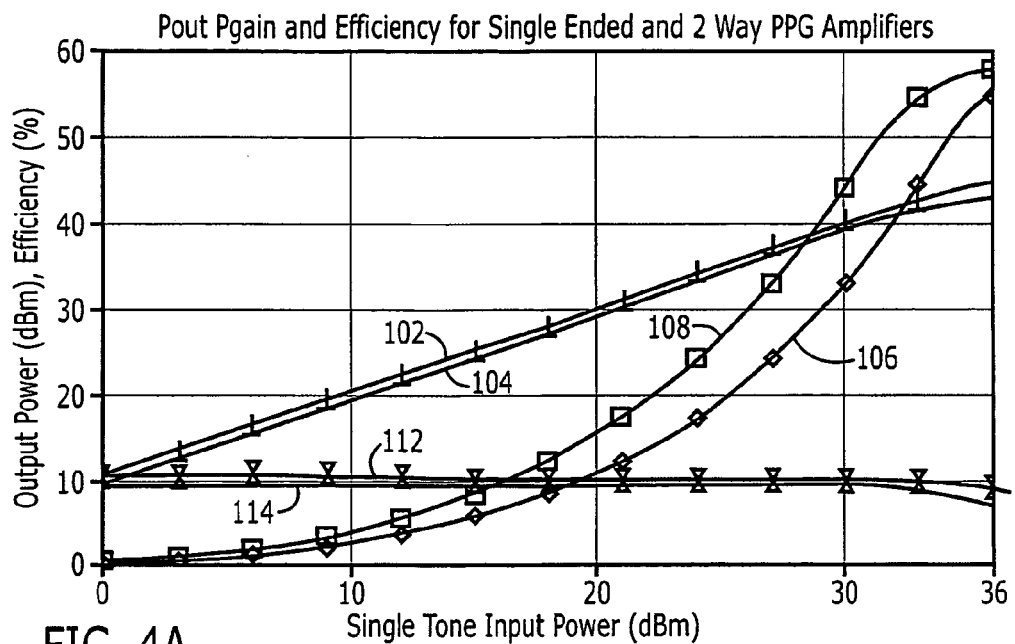
FIG. 4A is a graph of simulation results illustrating power, efficiency and gain for a two-way progressive power generating amplifier circuit according to some embodiments.

FIG. 4A is a graph of simulation results illustrating power, efficiency and gain for a two-way progressive power generating amplifier circuit according to some embodiments. A two-way progressive power generating amplifier (PPGA) according to some embodiments was simulated at 3.6 GHz without the input capacitor 56 or the transformer 58 illustrated in FIG. 2. Also simulated was a conventional (non-Doherty) parallel amplifier topology in which both amplifiers were biased in Class A/B and input power was split equally between the amplifiers. The output power (in dBm) of the conventional amplifier is shown as curve 102, while the output power of the PPGA is shown as curve 104. The gain (in dB) of the conventional amplifier is shown as curve 112, while the gain of the PPGA is shown as curve 114. The efficiency (%) of the conventional amplifier is shown as curve 106, while the efficiency of the PPGA is shown as curve 108. The efficiency of the PPGA is noticeably increased over the conventional amplifier topology, while the gain and output power are very close.

Figure 4B:
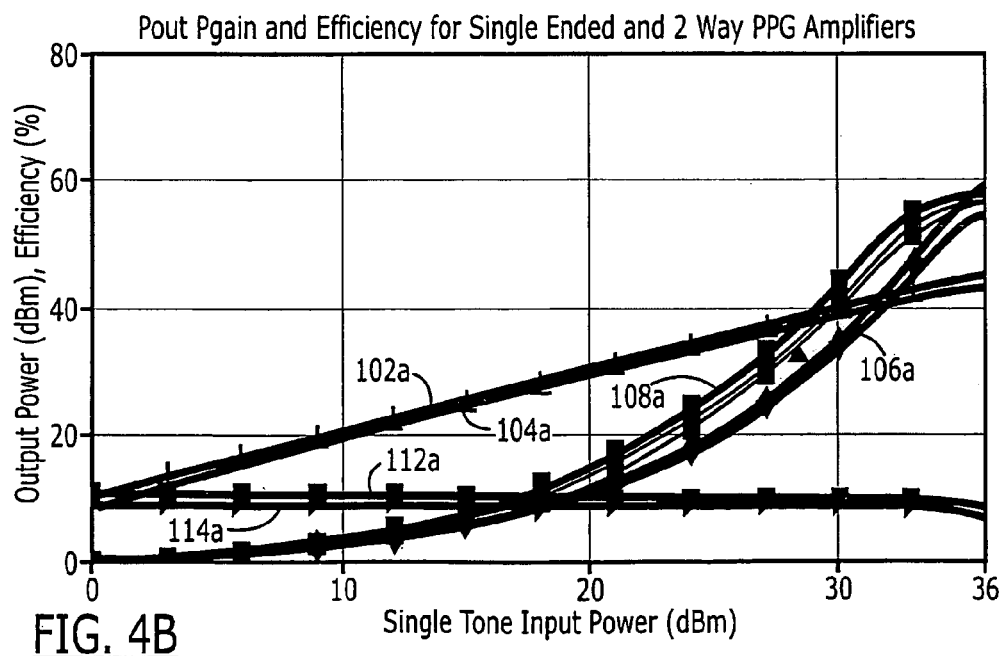
FIG. 4B is a graph of simulation results illustrating power, efficiency and gain over a range of operating frequencies for a two-way progressive power generating amplifier circuit according to some embodiments.

FIG. 4B is a graph of simulation results illustrating power, efficiency and gain over a range of operating frequencies from 3.3 GHz to 3.9 GHz for a two-way progressive power generating amplifier circuit according to some embodiments as well as a conventional parallel amplifier. The output power (in dBm) of the conventional amplifier is shown as a family of curves 102a, while the output power of the PPGA is shown as a family of curves 104a. The gain (in dB) of the conventional amplifier is shown as a family of curves 112a, while the gain of the PPGA is shown as a family of curves 114a. The efficiency (%) of the conventional amplifier is shown as a family of curves 106a, while the efficiency of the PPGA is shown as a family of curves 108a. The efficiency of the PPGA is noticeably increased over the conventional amplifier topology over the range of frequencies, while the gain and output power remain very close.

Figure 4C:
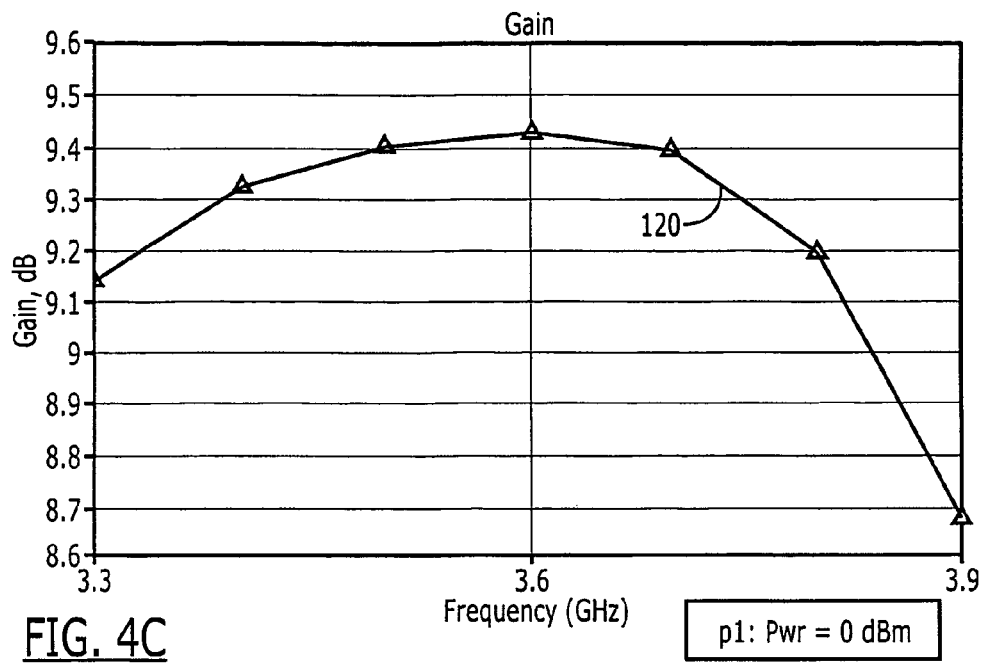
FIG. 4C is a graph of simulation results illustrating gain versus frequency for a two-way progressive power generating amplifier circuit according to some embodiments.

FIG. 4C is a graph 120 of simulation results illustrating gain versus frequency for a two-way progressive power generating amplifier circuit according to some embodiments. As shown therein, the gain remains relatively flat over a range of operating frequencies.

Figure 5A:
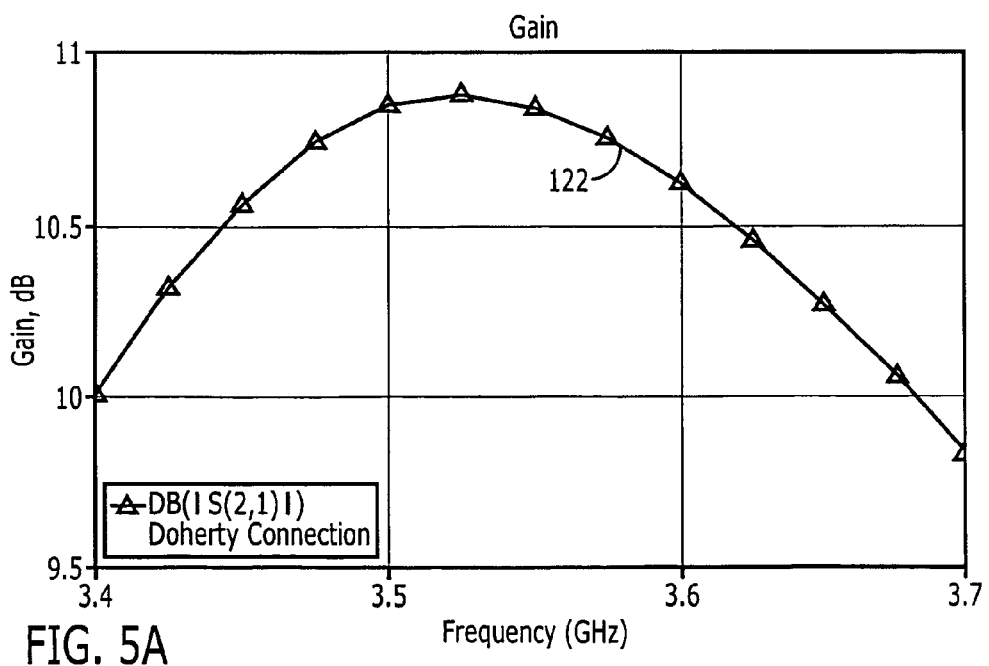
FIG. 5A is a graph of simulation results illustrating gain versus frequency for a two-way progressive power generating amplifier circuit according to further embodiments.

FIG. 5A is a graph of simulation results illustrating gain 122 versus frequency for a two-way progressive power generating amplifier circuit according to further embodiments. In particular, a two-way PPGA including an input capacitor and an output transformer were simulated. The gain characteristic increased noticeably when the input capacitor and output transformer were included.

Figure 5B:
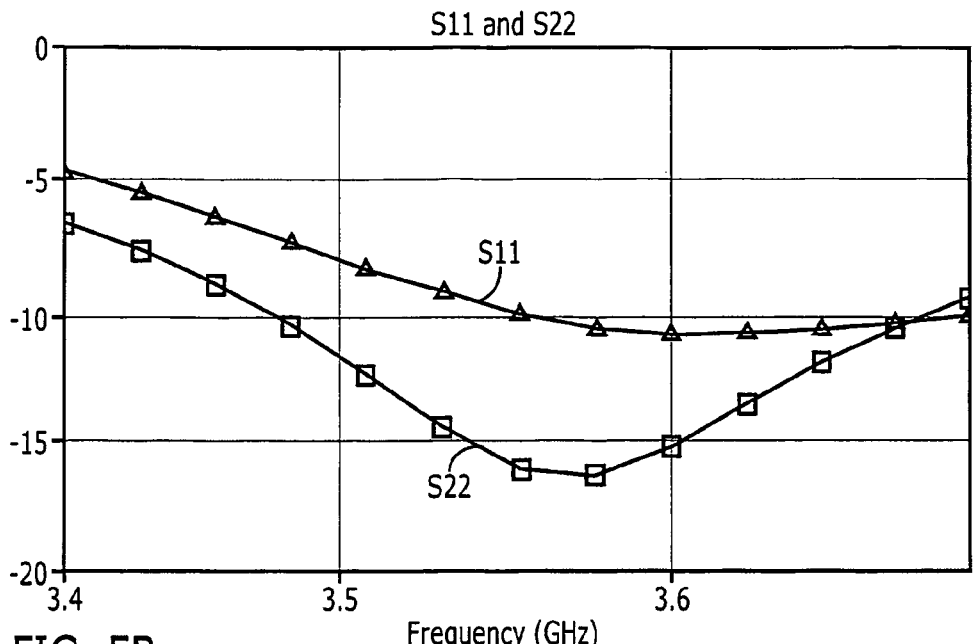
FIG. 5B is a graph of simulation results illustrating input and output reflection coefficients for a two-way progressive power generating amplifier circuit according to further embodiments.

FIG. 5B is a graph of simulation results illustrating input and output reflection coefficients S11 and S22 for a two-way progressive power generating amplifier circuit including the input capacitor and output transformer.

Figure 5C:
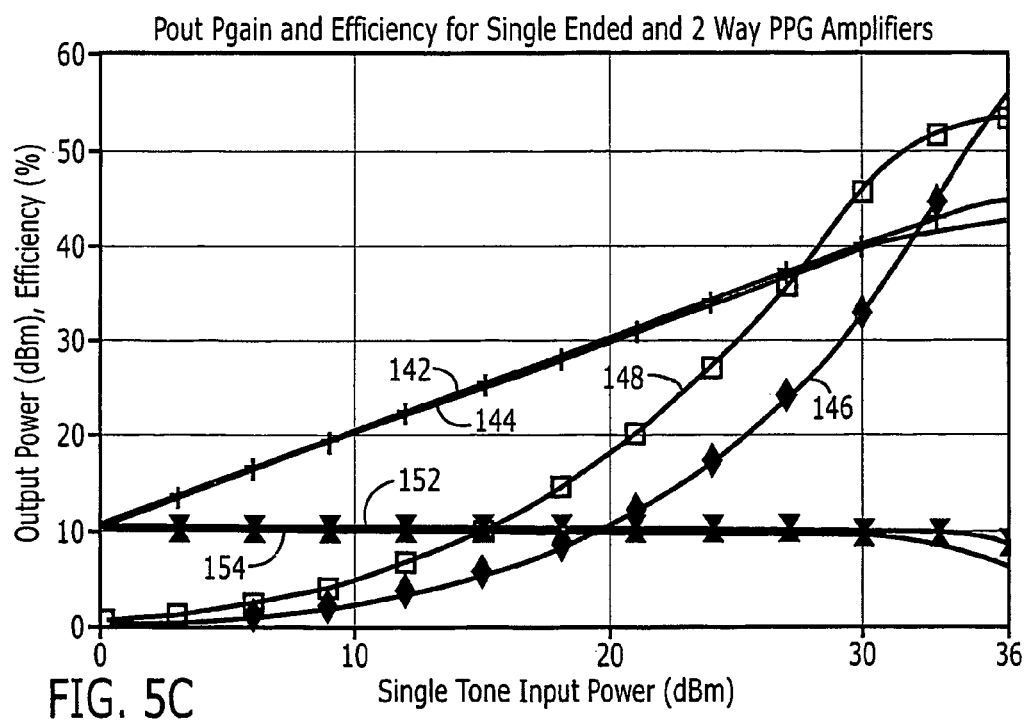
FIG. 5C is a graph of simulation results illustrating power, efficiency and gain for a two-way progressive power generating amplifier circuit according to further embodiments.

FIG. 5C is a graph of simulation results illustrating power, efficiency and gain for a two-way progressive power generating amplifier circuit including the input capacitor and output transformer compared to a conventional parallel amplifier. The output power of the conventional amplifier is shown as curve 142, while the output power of the PPGA is shown as curve 144. The gain (in dB) of the conventional amplifier is shown as curve 152, while the gain of the PPGA is shown as curve 154. The efficiency (%) of the conventional amplifier is shown as curve 146, while the efficiency of the PPGA is shown as curve 148.

Figure 6A:
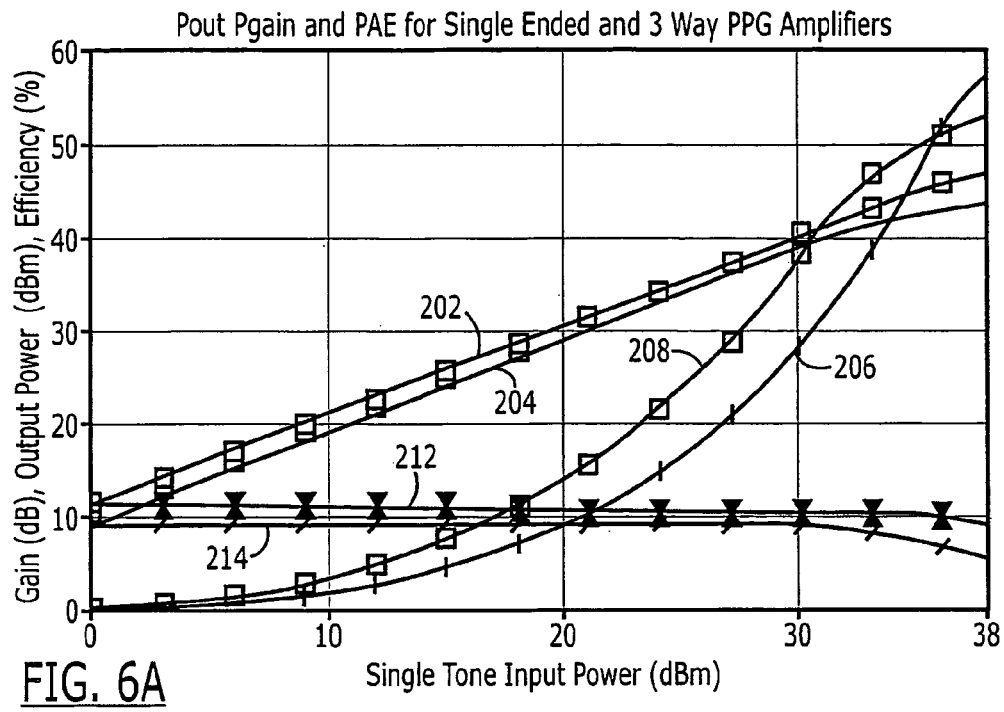
FIG. 6A is a graph of simulation results illustrating power, efficiency and gain for a three-way progressive power generating amplifier circuit according to some embodiments.

FIG. 6A is a graph of simulation results illustrating power, efficiency and gain for a three-way progressive power generating amplifier circuit according to some embodiments. The output power (in dBm) of the conventional three-way amplifier is shown as curve 202, while the output power of the three-way PPGA is shown as curve 204. The gain (in dB) of the conventional three-way amplifier is shown as curve 212, while the gain of the three-way PPGA is shown as curve 214. The efficiency (%) of the conventional three-way amplifier is shown as curve 206, while the efficiency of the three-way PPGA is shown as curve 208. The efficiency of the three-way PPGA is noticeably increased over the conventional amplifier topology, while the gain and output power are very close.

Figure 6B:
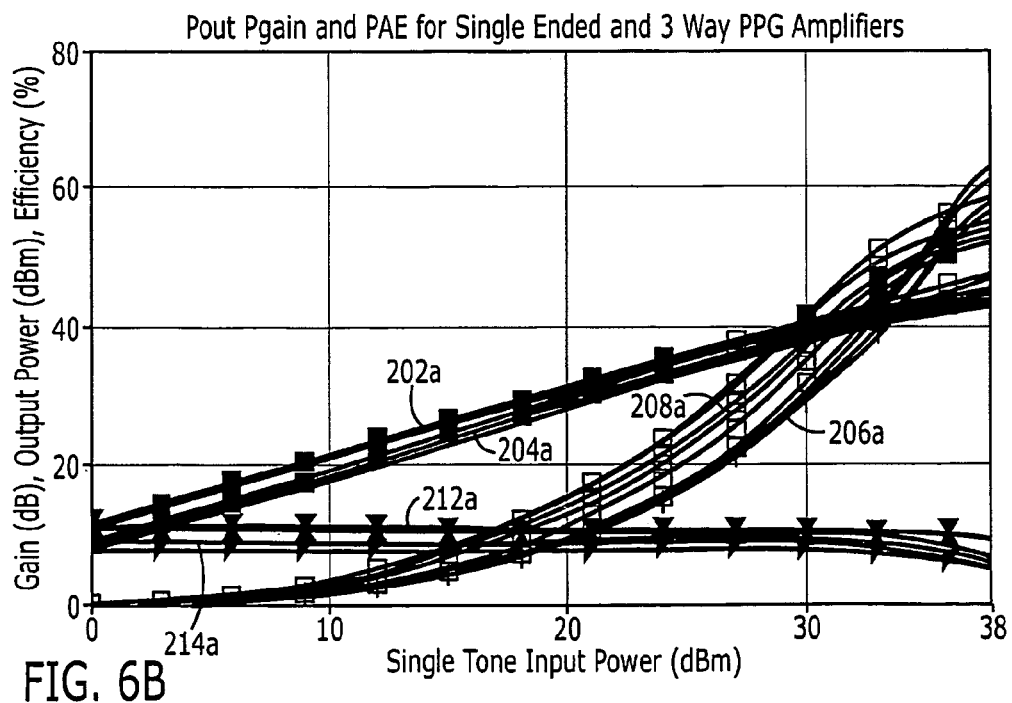
FIG. 6B is a graph of simulation results illustrating power, efficiency and gain over a range of operating frequencies for a three-way progressive power generating amplifier circuit according to some embodiments.

FIG. 6B is a graph of simulation results illustrating power, efficiency and gain over a range of operating frequencies for a three-way progressive power generating amplifier circuit according to some embodiments. The output power (in dBm) of the conventional three-way amplifier is shown as a family of curves 202a, while the output power of the three-way PPGA is shown as a family of curves 204a. The gain (in dB) of the conventional three-way amplifier is shown as a family of curves 212a, while the gain of the three-way PPGA is shown as a family of curves 214a. The efficiency (%) of the conventional three-way amplifier is shown as a family of curves 206a, while the efficiency of the three-way PPGA is shown as a family of curves 208a. The efficiency of the PPGA is noticeably increased over the conventional amplifier topology over the range of frequencies except near the band edge, which is close to the conventional single-ended topology, while the gain and output power remain very close.

Figure 6C:
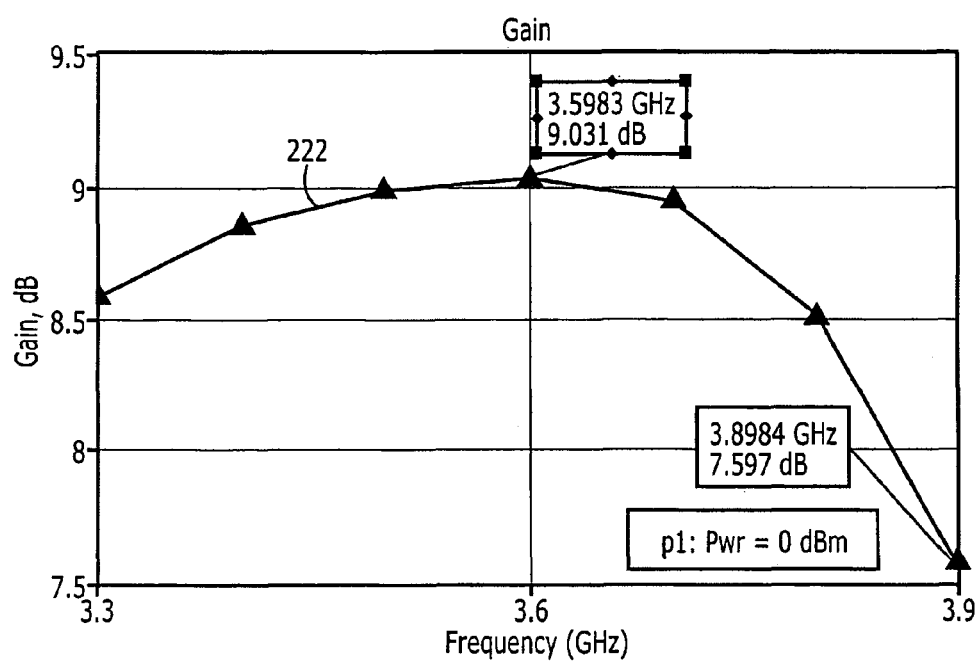
FIG. 6C is a graph of simulation results illustrating gain versus frequency for a three-way progressive power generating amplifier circuit according to some embodiments.

FIG. 6C is a graph of simulation results illustrating gain versus frequency for a three-way progressive power generating amplifier circuit according to some embodiments. As shown therein, the gain characteristic of the amplifier is relatively flat at frequencies around 3.6 GHz.

Some embodiments of the invention may be useful in high-efficiency communication power amplifiers for both narrow and wide band applications, such as CDMA, W-CDMA, WiMax, etc., using a number of different modulation schemes, such as FM, QPSK, QAM, etc.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A power amplifier circuit, comprising:
an input node configured to receive an input signal;
an unequal power splitter coupled to the input node and configured to split the input signal using an unequal power split and to provide a first power level signal to a first output node and a second power level signal to a second output node, wherein the second power level signal has a different power level than the first power level signal;
a first amplifier path coupled to the first output node of the unequal power splitter and including a first transistor amplifier configured to receive and amplify the first power level signal;
a second amplifier path coupled to the second output node of the unequal power splitter and including a second transistor amplifier configured to receive and amplify the second power level signal, wherein the second transistor amplifier is configured to turn on at a different power level of the input signal than the first transistor amplifier;
an unequal combiner configured to receive and combine the amplified first power level signal from the first amplifier path and the amplified second power level signal from the second amplifier path; and
a transformer coupled to an output of the unequal combiner.

2. The power amplifier circuit of claim 1, wherein the first transistor amplifier is biased for operation in Class A/B, and wherein the second transistor amplifier is biased for operation in Class C.

3. The power amplifier circuit of claim 1, wherein the unequal power splitter is configured to split the input signal at a power dividing ratio, and wherein the unequal power combiner is configured to combine the amplified first power level signal and the amplified second power level signal at a same ratio as the power dividing ratio.

4. The power amplifier circuit of claim 1, further comprising an input capacitor coupled between the input node and the unequal power splitter.

5. The power amplifier circuit of claim 1, wherein the first transistor amplifier has a first gate width and the second transistor amplifier has a second gate width larger than the first gate width.

6. The power amplifier circuit of claim 1, further comprising a first transmission line between the first transistor amplifier and the unequal combiner and a second transmission line between the second transistor amplifier and the unequal combiner, wherein the first transmission line has a phase length that is different from a phase length of the second transmission line.

7. The power amplifier circuit of claim 1, wherein the unequal power splitter is further configured to provide a third power level signal to a third output node, wherein the third power level signal has a different power level than the first power level signal, the power amplifier further comprising a third amplifier path coupled to the third output node of the unequal power splitter and including a third transistor amplifier configured to receive and amplify the third power level signal, wherein the third transistor amplifier is configured to turn on at a different power level than the first or second transistor amplifiers, wherein the unequal combiner is further configured to receive and combine the amplified third power level signal from the third amplifier path with the amplified first and second power level signals from the first and second amplifier paths.

8. The power amplifier circuit of claim 7, wherein the unequal power splitter is configured to split the input signal at a power dividing ratio, and wherein the unequal power combiner is configured to combine the amplified first power level signal and the amplified second power level signal at a same ratio as the power dividing ratio.

9. The power amplifier circuit of claim 8, wherein the unequal power splitter is configured to split the input signal into a −A dB signal at the first output node, a −B dB signal at the second output node and a −C dB signal at the third output node, and wherein the unequal power combiner is configured to combine the amplified first power level signal at a level of −A dB, the amplified second power level signal at a level of −B dB, and the amplified third power level signal at a level of −C dB, wherein A is not equal to B and A is not equal to C.

10. The power amplifier circuit of claim 9, wherein A equals −1.5 and B equals −8.4 and C equals −8.4.

11. The power amplifier circuit of claim 7, wherein the first transistor amplifier is biased for operation in Class A/B, the second transistor amplifier is biased for operation in Class B or Class C, and the third transistor amplifier is biased for operation in Class C.

12. The power amplifier circuit of claim 7, wherein the first transistor amplifier has a first gate width, the second transistor amplifier has a second gate width that is larger than the first gate width, and the third transistor amplifier has a third gate width that is larger than the first gate width.

13. The power amplifier circuit of claim 7, further comprising a first transmission line between the first transistor amplifier and the unequal combiner, a second transmission line between the second transistor amplifier and the unequal combiner, and a third transmission line between the third transistor amplifier and the unequal combiner, wherein the first transmission line has a phase length that is different from a phase length of the second transmission line or the third transmission line.

14. A power amplifier circuit, comprising:
an input node configured to receive an input signal;
an unequal power splitter coupled to the input node and configured to split the input signal using an unequal power split and to provide a first power level signal to a first output node and a second power level signal to a second output node, wherein the second power level signal has a different power level than the first power level signal;

a first amplifier path coupled to the first output node of the unequal power splitter and including a first transistor amplifier configured to receive and amplify the first power level signal;

a second amplifier path coupled to the second output node of the unequal power splitter and including a second transistor amplifier configured to receive and amplify the second power level signal, wherein the second transistor amplifier is configured to turn on at a different power level of the input signal than the first transistor amplifier; and an unequal combiner configured to receive and combine the amplified first power level signal from the first amplifier path and the amplified second power level signal from the second amplifier path;

wherein the unequal power splitter is configured to split the input signal at a power dividing ratio, and wherein the unequal power combiner is configured to combine the amplified first power level signal and the amplified second power level signal at a same ratio as the power dividing ratio; and wherein the unequal power splitter is configured to split the input signal into a −A dB signal at the first output node and a −B dB signal at the second output node, and wherein the unequal power combiner is configured to combine the amplified first power level signal at a level of −A dB and the amplified second power level signal at a level of −B dB, wherein A is not equal to B.

15. The power amplifier circuit of claim 14, wherein A equals −1 and B equals −6.9.

16. A power amplifier circuit, comprising:

an input node configured to receive an input signal;

an unequal power splitter coupled to the input node and configured to split the input signal using an unequal power split and to provide a first power level signal to a first output node and a second power level signal to a second output node, wherein the second power level signal has a different power level than the first power level signal;

a first amplifier path coupled to the first output node of the unequal power splitter and including a first transistor amplifier configured to receive and amplify the first power level signal;

a second amplifier path coupled to the second output node of the unequal power splitter and including a second transistor amplifier configured to receive and amplify the second power level signal, wherein the second transistor amplifier is configured to turn on at a different power level of the input signal than the first transistor amplifier; and an unequal combiner configured to receive and combine the amplified first power level signal from the first amplifier path and the amplified second power level signal from the second amplifier path;

wherein the unequal splitter comprises an in phase splitter and wherein the unequal combiner comprises an in phase combiner.

\* \* \* \* \*